United States Patent [19]

Chang et al.

[11] Patent Number: 4,775,642
[45] Date of Patent: Oct. 4, 1988

[54] MODIFIED SOURCE/DRAIN IMPLANTS IN A DOUBLE-POLY NON-VOLATILE MEMORY PROCESS

[75] Inventors: Kuang-Yeh Chang, Austin; Charles F. Hart, Pflugerville; Yee-Chaung See, Austin, all of Tex.

[73] Assignee: Motorola, Inc., Schaumburg, Ill.

[21] Appl. No.: 10,257

[22] Filed: Feb. 2, 1987

[51] Int. Cl.$^4$ .................................. H01L 21/265
[52] U.S. Cl. ............................. 437/44; 437/52; 437/57; 437/43; 357/42
[58] Field of Search .............. 29/571, 577 C, 576 B, 29/578; 357/45, 54; 437/43, 44, 52, 186, 191, 57

[56] References Cited

U.S. PATENT DOCUMENTS

| | | | |
|---|---|---|---|
| 4,590,665 | 5/1986 | Owens et al. | 29/571 |
| 4,598,460 | 7/1986 | Owens et al. | 29/571 |
| 4,646,425 | 3/1987 | Owens et al. | 29/571 |

Primary Examiner—Brian E. Hearn
Assistant Examiner—M. Wilczewski
Attorney, Agent, or Firm—John A. Fisher; Jeffrey Van Myers; Jonathan P. Meyer

[57] ABSTRACT

Implementing modified souce/drain implants in a non-volatile memory process while leaving the source/drain regions in the memory cells of the device unmodified and adding no critical mask steps. Methods for implementing both low dose drain and graded source/drain modifications in a double poly non-volatile memory process include the possibility of leaving the spacers used to modify the peripheral source/drain regions in place in the array portion of the device. Alternate methods include the possibility of removing the spacers in the array portion without the addition of critical mask steps and of keeping the spacers out of the array portion entirely.

19 Claims, 14 Drawing Sheets

MODIFIED SOURCE/DRAIN IMPLANTS IN A DOUBLE-POLY NON-VOLATILE MEMORY PROCESS

FIELD OF THE INVENTION

The present invention relates, in general, to a method of incorporating modified source/drain implants into a double-poly non-volatile memory process. More particularly, the invention relates to a method for manufacturing non-volatile semiconductor memory devices having peripheral transistors with modified source/drain implants.

BACKGROUND OF THE INVENTION

Many non-volatile semiconductor memories, such as EPROMs, rely on so-called "hot electrons" and other phenomena associated with very small geometry MOS devices to provide the mechanism by which charge is accumulated on the floating gates of the transistors in the memory array. Therefore, any process for fabricating such memories must retain, at least to some degree, the desired phenomena.

However, any non-volatile memory device must include, in addition to the array of memory cells, certain peripheral circuits including address decoders, sense amplifiers and other logic. The small geometry-related phenomena upon which the memory cells rely adversely effect the transistors comprising the peripheral circuits and require the use of various solutions which typically sacrifice die area or performance.

Several techniques are in common use which provide relief from certain small geometry-related phenomena. For instance, techniques referred to variously as "low dose drain", "lightly-doped drain" and "graded source/drain" all involve some modification to the lateral and possibly the vertical dopant profile of the source/drain regions. Of particular interest in the case of peripheral circuits on a nonvolatile memory are lateral profile modifications which provide relief from short-channel induced hot electron effects.

Up to now, however, it has not been shown that one can successfully merge the modified source/drain techniques with a process capable of fabricating useful non-volatile memories in such a way that the peripheral circuits are provided the benefits of the modified regions while preserving the functionality of the memory cells without incurring the penalty of extra critical mask steps which complicate the process.

Throughout the following description, it will be understood that when a material is referred to as "poly", the material may be poly-crystalline silicon or a multi-layer construct including both a metal silicide such as tungsten silicide and poly-crystalline silicon. In addition, it will be understood that two distinct types of modified source/drain processes will be referred to as "low dose drain" (LDD) and "graded source/drain" (GSD), respectively. LDD processes are characterized by an initial, grading implant followed by the formation of a spacer followed by a second, higher dose implant. GSD processes are characterized by the formation of a spacer, followed by a grading implant with a fast-diffusing species and a source/drain implant with a slow-diffusing species. While the usage of these terms is not well settled in the art, this usage will be followed for present purposes. Both processes, and other similar processes, will be referred to as modified source/drain processes.

SUMMARY OF THE INVENTION

Accordingly, it is an object of the present invention to provide modified source/drain implants in a double-poly non-volatile memory process.

Yet another object of the invention is to provide a method of manufacturing non-volatile memory devices with modified source/drain regions only in peripheral circuits.

These and other objects and advantages of the present invention are provided by a method of manufacturing a non-volatile memory comprising the steps of: defining, at a first face of a body of semiconductor material, a plurality of active regions comprising first and second groups thereof, said first group of active regions forming an array portion of the memory and said second group forming a peripheral portion of the memory; forming and partially patterning first and second poly layers over said first face of said body of semiconductor material, said first and second poly layers being completely patterned over said periphery portion of said memory and being partially patterned over said array portion of said memory; performing at least one grading implant to partially form modified source/drain regions in said first face of said body of semiconductor material within said active regions of said second group thereof; completing the patterning of said first and second poly layers; and performing at least one implant to complete the formation of said modified source/drain regions and to form source/drain regions in said first face of said body of semiconductor material within said active regions of said first group thereof.

These and other objects and advantages of the present invention will be more apparent from the detailed description below taken together with the drawings.

DETAILED DESCRIPTION OF THE INVENTION

Referring first to FIGS. 1A-1I, an example of the manufacture of a non-volatile memory device according to one aspect of the present invention is illustrated by means of a series of cross-sectional views. One skilled in the art will understand that certain features of the Figures are not to scale; in particular, the thickness of the various layers illustrated is not to scale. In addition, the juxtaposition of the various transistors illustrated is chosen simply to best illustrate all of the features of the device and does not imply a particular layout or organization of the device.

Figure 1A:
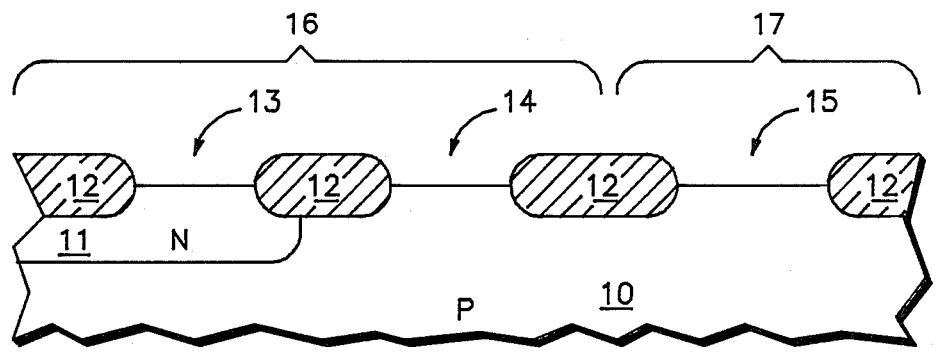
FIGS. 1A-1I are cross-sectional views of a non-volatile memory device illustrating various stages in the manufacture thereof according to one aspect of the present invention.

FIG. 1A illustrates a common starting point for each of the various aspects of the present invention. A substrate 10 of semiconductor material may comprise, for instance, P-type mono-crystalline silicon with a conductivity in the range of 14–35 ohm-cm. Substrate 10 is suitable for the formation of N-channel, enhancement-type MOS field effect transistors, as is familiar in the art. In order to accommodate the formation of P-channel, enhancement-type MOS field effect transistors, an N-type tub, or well 11 has been formed in a portion of substrate 10. Well 11 may have a sheet rho in the range of 1.2–1.8 Kohm/sq.

A patterned field oxide 12 covers portions of a surface of substrate 10 and well 11 defining a plurality of active regions 13, 14 and 15 which are isolated from one another by field oxide 12 and in which the surface of substrate 10 or well 11 is exposed. For purposes of the present invention, each of the plurality of active regions may be thought of as lying in either peripheral portion 16 or array portion 17 of the non-volatile memory device being fabricated. N-channel array transistors will be fabricated in the active regions lying within array portion 17. P-channel and N-channel peripheral transistors will be fabricated in those active regions lying within peripheral portion 16. For convenience, actions taken with respect to active region 15 will be assumed to be taken with respect to all active regions within array portion 17. Similarly, active region 14 is assumed to be typical of the P-type active regions in peripheral portion 16 and active region 13 is assumed to be typical of the N-type active regions in peripheral portion 16.

The techniques necessary to achieve the starting point illustrated in FIG. 1A are well known in the art and will not be described in detail herein.

Figure 1B:
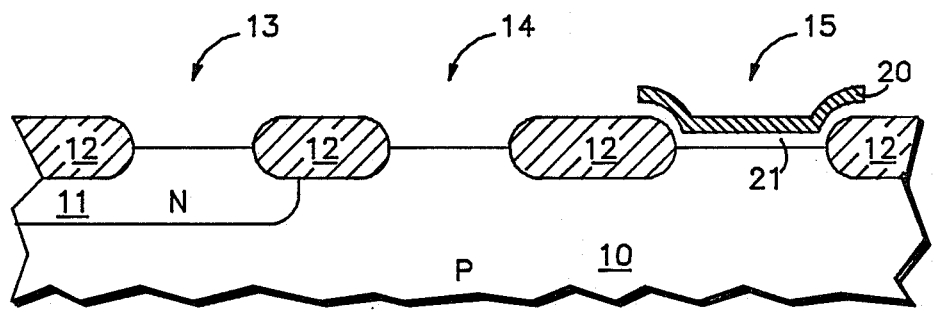

Referring now to FIG. 1B, the device is illustrated after intervening process steps have formed and patterned a first poly layer 20. First poly 20 overlies active region 15 and the adjacent portions of field oxide 12. First poly 20 is separated from the surface of substrate 10 and from field oxide 12 by a dielectric layer 21.

In this particular aspect of the present invention, first poly 20 will form only the floating gates of the transistors in array portion 17. This implies that the sheet rho of first poly 20 is not of particular concern and that it can be made relatively thin. For example, first poly 20 might be a poly-crystalline silicon layer formed by chemical-vapor deposition (CVD) with a thickness in the range of 1.5–3.0 thousand angstroms and doped by $PH_3$ to a sheet rho in the range of 12–30 ohm/sq.

Dielectric 21 is a gate-quality dielectric, most commonly a thermal oxide. In many non-volatile memories (certain types of EEPROMs), dielectric 21 will have a portion of reduced thickness to provide a path for a tunneling current used to erase the memory. Typically, the thickness of dielectric 21 will range from 80–150 angstroms in a tunneling area and from 250–400 angstroms elsewhere. For convenience, dielectric 21 is not shown explicitly, except by the separation of first poly 20 from substrate 10. This convention will be followed throughout for inter-layer dielectrics.

Figure 1C:
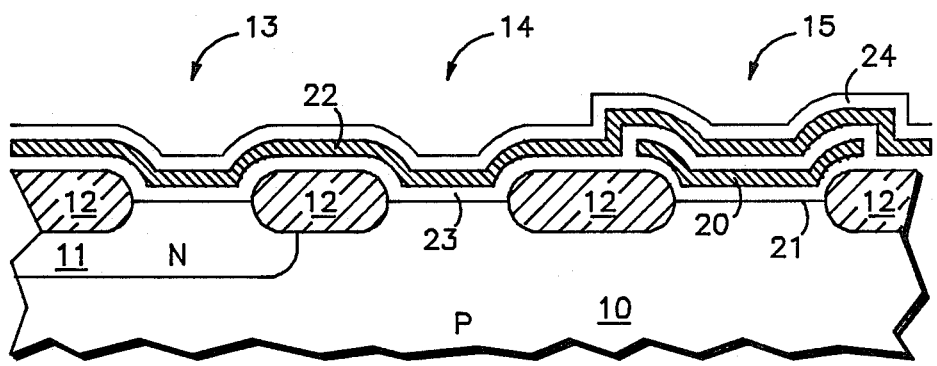

Referring now to FIG. 1C, the device is illustrated after intervening process steps have formed, but not yet patterned, a second poly layer 22 overlying the entire device and a protective layer 24 overlying second poly 22. Second poly 22 is separated from all underlying layers by a dielectric layer 23.

In this particular aspect of the present invention, second poly 22 will form the gates of all of the peripheral transistors and the control gates of the transistors in array portion 17. A fairly typical example of second poly 22 would be a multi-layer structure formed of poly-crystalline silicon and a refractory metal silicide such as $WSi_2$. The polysilicon could be formed by CVD and the silicide also by CVD. The total thickness of second poly 22 could be in the range of 3500–5000 angstroms. Second poly 22 may be doped by $PH_3$ to a sheet rho in the range of 12–30 ohm/sq.

Dielectric 23, which separates second poly 22 from the underlying structures, is a gate-quality dielectric which would most commonly be formed in a single thermal oxidation step. Thus, over active areas 13 and 14, dielectric 23 would be a silicon oxide, commonly with a thickness in the range of 250–400 angstroms, and over first poly 20 dielectric 23 would be a polysilicon oxide, commonly with a thickness in the range of 330–600 angstroms.

Protective layer 24, which overlies second poly 22, will serve to protect second poly 22 from the etchant which will later pattern first poly 20 in a self-aligned etch step. Most commonly, protective layer 24 is a thermal oxide or an undoped, low-temperature chemical vapor deposited oxide (LTO) and has a thickness in the range of 1000–3000 angstroms.

Figure 1D:
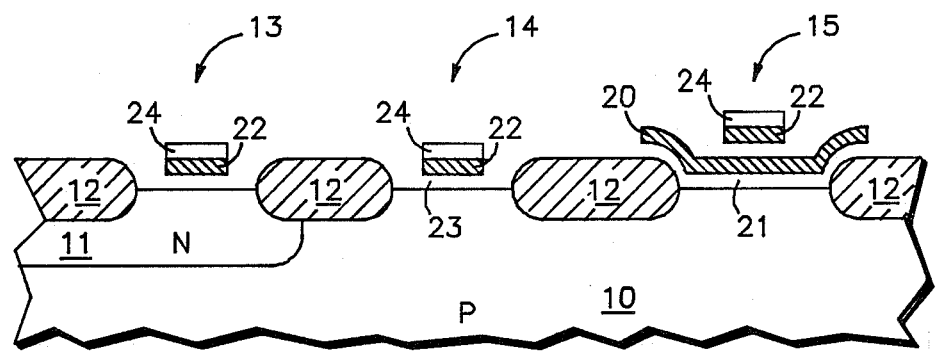

Referring now to FIG. 1D, the memory is illustrated after intervening process steps have patterned protective layer 24 and second poly 22 with a common mask. This common mask is such that second poly 22 is patterned to form the gates of the transistors to be fabricated in active areas 13 and 14 and the control gate of the non-volatile memory transistor to be fabricated in active area 15. Of course, the actual geometry of these gates is not intended to be inferred from these Figures. The processes useful for etching protective layer 24 and second poly 22 are familiar in the art.

Figure 1E:
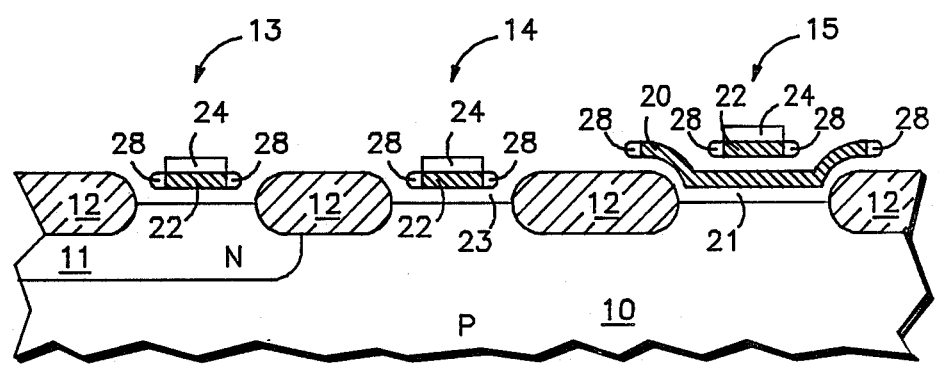

Referring now to FIG. 1E, the memory device is illustrated after intervening process steps have formed sidewall oxide spacers 28 on the exposed edges, or sidewalls, of each portion of first poly 20 and second poly 22. Sidewall spacers 28 are typically formed by means of a simple thermal oxidation step. According to this aspect of the present invention, oxide spacers 28 may have a thickness in the range of 0–600 angstroms. As will be more apparent from the following discussion of the implant steps, the region under sidewall spacers 28 will form relatively lightly doped P- or N-type regions which separate the relatively highly doped source/drain regions from the respective channel regions, thus lessening short-channel induced hot electron phenomena in the peripheral transistors.

The step of forming the sidewall spacers is the first step in the described process which differs from a standard non-volatile memory process. However, since the step which produces the spacers is simply a thermal oxidation step, no masks are introduced into the process at this point.

Figure 1F:
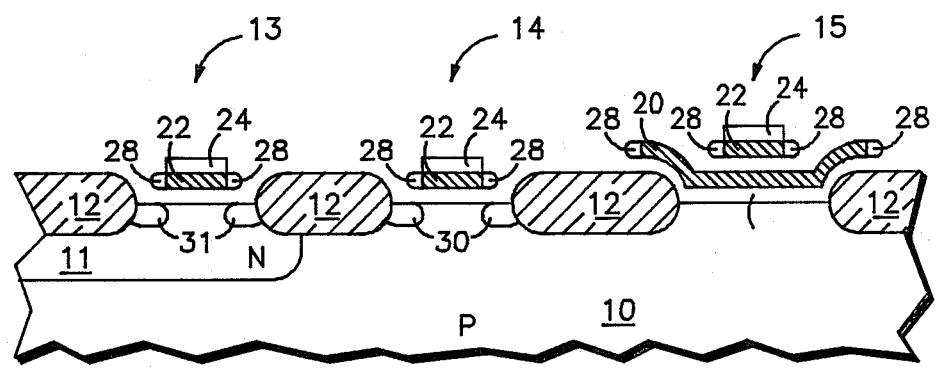

Referring now to FIG. 1F, the device is illustrated after intervening process steps have formed N-type and P-type implants 30 and 31, respectively. N-type implants 30 are disposed in active region 14 and were implanted with protective layer 24, second poly 22 and sidewall spacers 28 as a self-aligned mask. Similarly, P-type implants 31 are disposed in active region 13 and were implanted with protective layer 24, second poly 22 and sidewall spacers 28 as a self-aligned mask.

Implants 30 and 31 will form the lightly doped regions under spacers 28 after subsequent thermal cycles cause the implanted dopant atoms to diffuse laterally. Implants 30 and 31 will be referred to as the grading implants, because their function is to make more gradual the junctions between the later-formed source/drain regions and substrate 10 or well 11, as the case may be. It is generally desirable that the dopant species chosen for grading implants 30 and 31 be relatively fast-diffusing species. For example, N-type grading implants 30 may be formed by the implantation of phosphorous at a beam energy of 40 KeV to a dose of $5 \times 10^{13}$. P-type grading implants 31 may be formed by the implantation of boron, typically through the use of a boron fluoride source, at a beam energy of 30 KeV to a dose of $1 \times 10^{14}$. Either after each implantation or after both have been completed, annealing in a nitrogen ambient is commonly applied.

The process steps necessary to produce grading implants 30 and 31 are familiar in the art and do not involve the introduction of critical mask steps into the overall process flow.

Figure 1G:
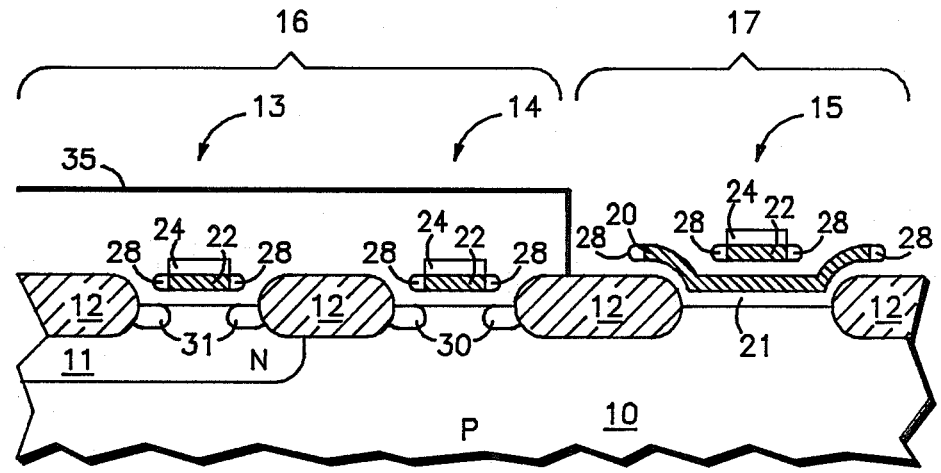

Referring now to FIG. 1G, the device is illustrated after intervening process steps have formed a self-aligned etch mask 35 covering peripheral portion 16. The purpose of self-aligned etch mask 35 is to allow the patterning of first poly 20 in array portion 17, using protective layer 24, second poly 22 and sidewalls spacers 28 as a self-aligned mask, without altering the devices in peripheral portion 16. Self-aligned etch mask 35 may be, for instance, a common photoresist mask. This mask step would be necessary without regard to the use of modified source/drain regions in peripheral portion 16 and is, in any event, a non-critical mask step.

Figure 1H:
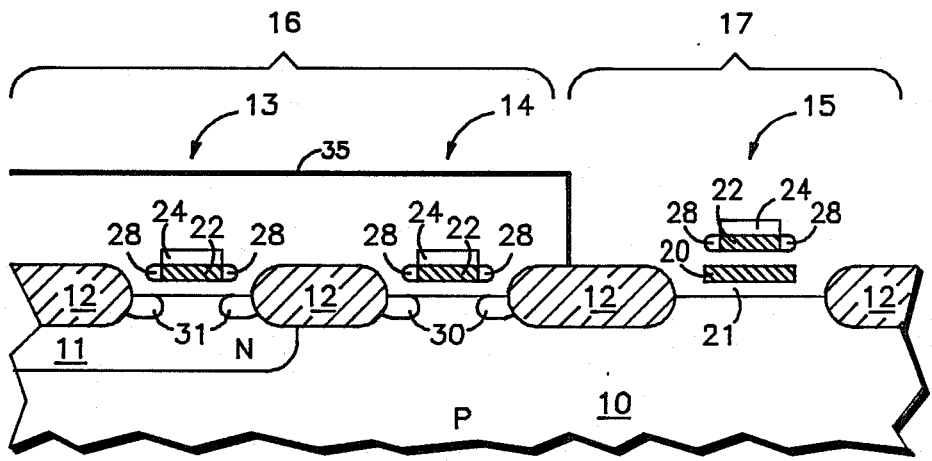

Referring now to FIG. 1H, the device is illustrated after intervening process steps have patterned first poly 20 in array portion 17. A conventional poly etch process which is selective to oxide is employed to pattern first poly 20. Protective layer 24 and sidewall spacers 28 protect second poly 22 in peripheral portion 17 and self-aligned etch mask 35 protects all structures in peripheral portion 16 from attack by the etchant. This etch process is exactly the same as would be used regardless of the use of modified source/drain regions except that the presence of sidewall spacers 28 makes the remaining portion of first poly 20, the floating gate, slightly wider than would have been the case otherwise. This increases the effective gate length of each of the floating gate non-volatile memory cells.

Figure 1I:
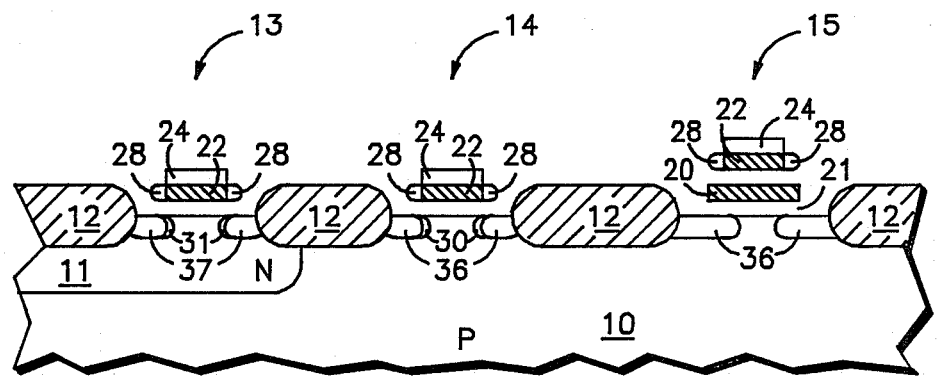

Referring now to FIG. 1I, the device is illustrated after intervening process steps have removed the self-aligned etch mask and formed N-type source/drain implants 36 and P-type source/drain implants 37. These implants are performed as they usually would be, without regard to the prior grading implants. It is generally desirable that the source/drain implants be carried out with dopant species which diffuse somewhat less rapidly than those used for the grading implants. For instance, N-type source/drain implants 36 may be performed using arsenic with a beam energy of 80 KeV and a dose of $7 \times 10^{15}$. P-type source/drain implants 37 may be performed using $BF_2$ with a beam energy of 80 KeV and a dose of $5.5 \times 10^{15}$.

From this point onward, the fabrication of the device follows entirely standard process steps to complete the interconnection of the various devices and other necessary steps. These will not be described in detail herein.

The grading of the source/drain regions in peripheral portion 16 of the device relies upon a combination of the faster diffusion rate of the dopant implanted in the first, grading implant and the fact that the grading implants experience more thermal cycles than do the later source/drain implants. The sidewall spacers serve both to set back the grading implants so as to prevent them from encroaching under the gates too far and to protect the edges of the gate oxide from damage during the source/drain implant steps. Since the sidewall spacers also necessarily increase the effective gate length of the floating gate devices, which may be considered to be undesirable, it is advantageous to make the sidewall spacers as small as possible. It has even been found to be possible to grow only a minimal sidewall oxide spacer to protect the underlying gate edges from implant damage, thus reducing the acceptable minimum spacer width effectively to zero.

The above-described process allows the implementation of modified source/drain regions in the periphery of a non-volatile memory device without incurring the penalty of more critical mask steps. The particular type of modified source/drain regions implemented is of the GSD-type referred to above. Since the sidewall spacers which are a part of the modified source/drain process described were never removed, no critical mask step was added. One possible modification to the process flow described which would not alter this advantage of the present invention is the use of a blanket N-type ion implantation for the grading implant. Instead of masking prior to performing the N-type grading implant, as was assumed above, it is possible to implant the N-type dopant into all active areas of the device and rely on the later, masked P-type implants into those active areas on the surface of N-type wells to reverse the conductivity type of the appropriate source/drain regions.

As previously mentioned, while the above-described process avoids the use of extra critical mask steps to implement modified source/drain regions, it does result in a somewhat increased effective gate length for the array devices than would otherwise be the case. FIGS. 2A-2D, below, illustrate a slightly modified version of the process described above which addresses this concern. Because the modifications are minor, much of the detail provided above is omitted from the following description.

Figure 2A:
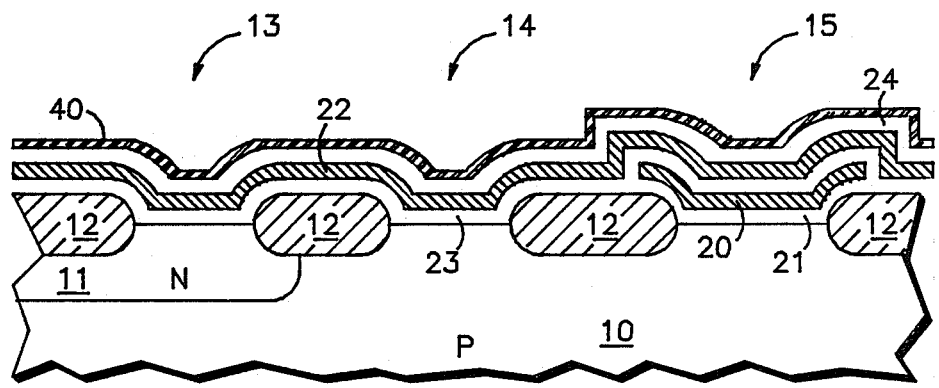
FIGS. 2A-2D are cross-sectional views of a non-volatile memory device illustrating various stages in the manufacture thereof according to another aspect of the present invention.

Referring now to FIG. 2A, a non-volatile memory device is illustrated. The starting point for this embodiment of the present invention is the same as was described with reference to FIG. 1A. The modified process proceeds through the formation of first poly 20 and its underlying dielectric 21, second poly 22 and its underlying dielectric 23 and protective layer 24 in the same fashion as was described above. Following the formation of protective layer 24, a second protective layer 40 is formed immediately thereover. Second protective layer 40 is advantageously a silicon nitride or polysilicon layer formed by well known methods. It is important that the material of second protective layer 40 be chosen so that the spacer material is etchable with a process which is selective to the material of second protective layer 40. The selection of oxide and nitride or polysilicon, respectively, for the spacer material and second protective layer 40 is the most common one for this situation.

Figure 2B:
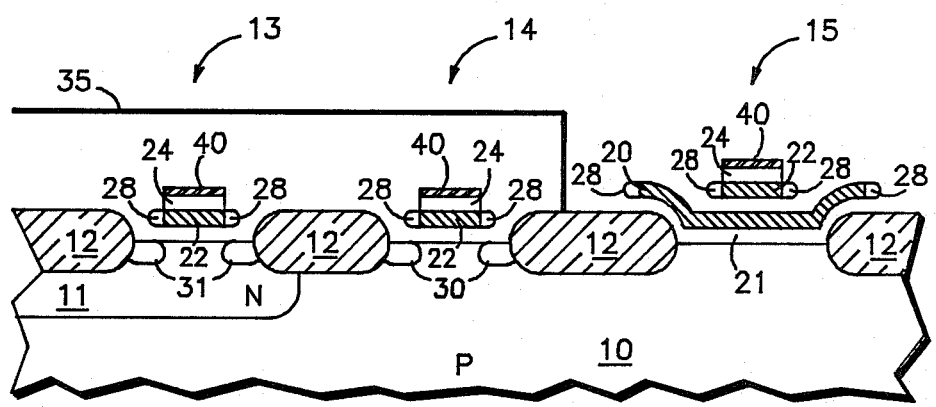

Referring now to FIG. 2B, the device is illustrated after intervening process steps have patterned second poly 22, first protective layer 24 and second protective layer 40, formed sidewall spacers 28 and formed self-aligned etch mask 35, all in substantially the same manner as was described above. The only difference from the above-described process to this point is the addition of second protective layer 40.

Figure 2C:
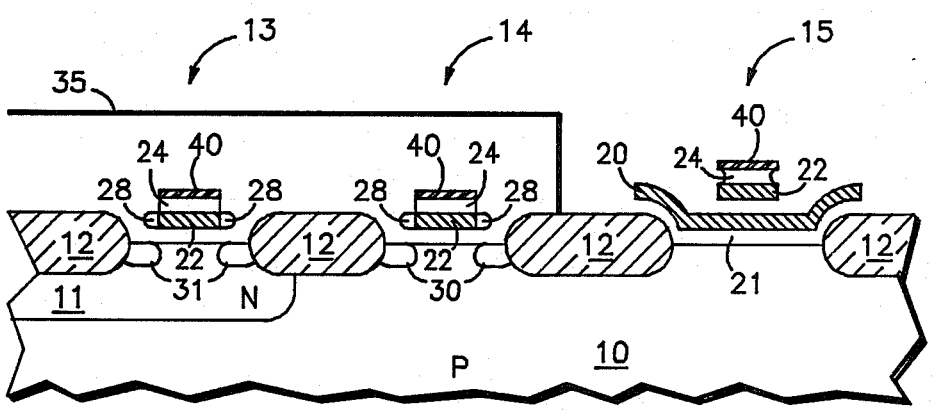

Referring now to FIG. 2C, the device is illustrated after intervening process steps have removed sidewall spacers 28 in array portion 17. This is easily performed with an etchant which removes the oxide which forms sidewall spacers 28, but which is selective to the material of second protective layer 40 and to the material of first poly 20. If, as shown, first protective layer 24 is also an oxide layer, it will be undercut from beneath second protective layer 40, as is illustrated here. While this step of removing sidewall spacers 28 represents an extra etch step, it involves no extra critical mask, since the same self-aligned etch mask 35 which serves when first poly 20 is patterned also serves to preserve sidewall spacers 28 in peripheral portion 16 of the device.

Figure 2D:
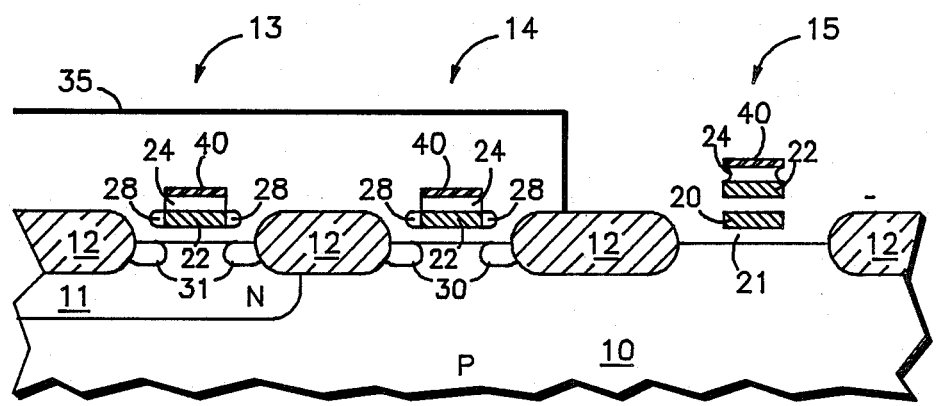

Referring now to FIG. 2D, the device is illustrated after intervening process steps have patterned first poly 20 using the overlying structures as a self-aligned mask, as was described above with reference to FIG. 1H. As is apparent, the removal of sidewall spacers 28 in array portion 17 allows first poly 20 to be patterned to the same width as second poly 22, instead of slightly wider, as was the case above. From this point onward, the process according to this variation is the same as was described above, and will not be detailed further. One impact on the process should be noted however. The presence of an overlying nitride layer, for instance second protective layer 40, when an ion implantation using a BF$_2$ source is performed, for instance to form the source/drain regions in active area 13, may cause problems due to the trapping of fluorine ions by the nitride and later outgassing. One possible solution is to remove the nitride prior to performing the P-type source/drain implants. Another is to use an elemental boron source rather than BF$_2$. This concern does not exist, however, if polysilicon is used instead of nitride for second protective layer 40.

Figure 3A:
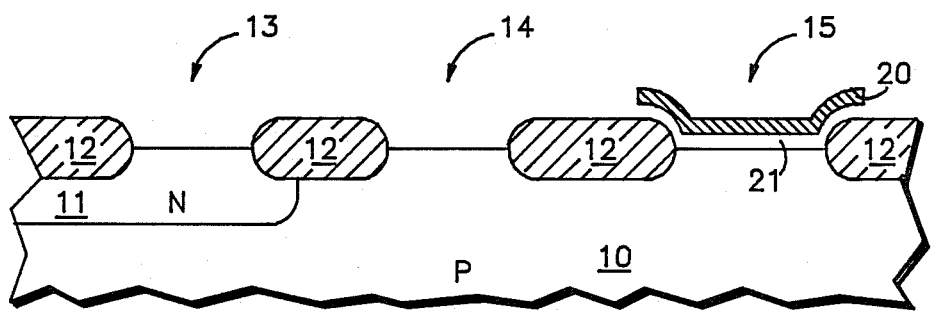
FIGS. 3A-3F are cross-sectional views of a non-volatile memory device illustrating various stages in the manufacture thereof according to still another aspect of the present invention.

FIGS. 3A-3F illustrate yet another aspect of the present invention. The process variation illustrated here involves a similar GSD-type of implant modification, but follows a slightly different process sequence to achieve the result. The starting point of the described process is the same as was described above with reference to FIG. 1A. FIG. 3A illustrates the device after intervening process steps have formed and patterned first poly 20 in the same manner as was described above.

Figure 3B:
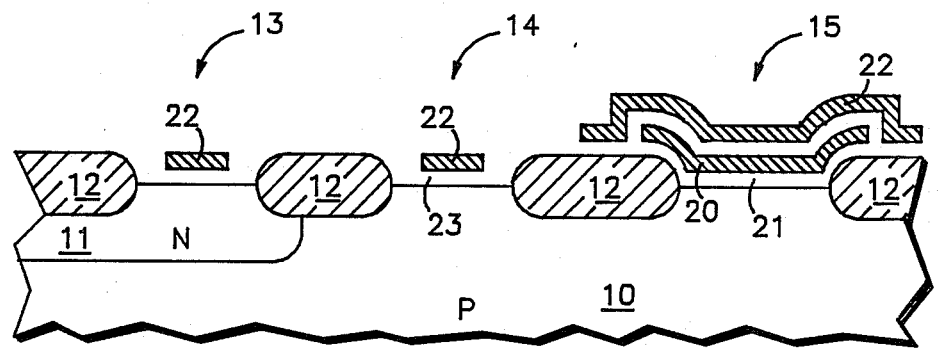

FIG. 3B illustrates the device after intervening process steps have formed and patterned second poly 22 overlying dielectric 23. The differences between this intermediate point in the process flow and that described with reference to FIG. 1D are that no protective layer is formed overlying second poly 22 and that the pattern of second poly 22 is different. In this example, second poly 22 is fully patterned, that is, patterned to its final geometry, only in peripheral portion 16. In array portion 17, second poly 22 is left covering all of first poly 20.

Figure 3C:
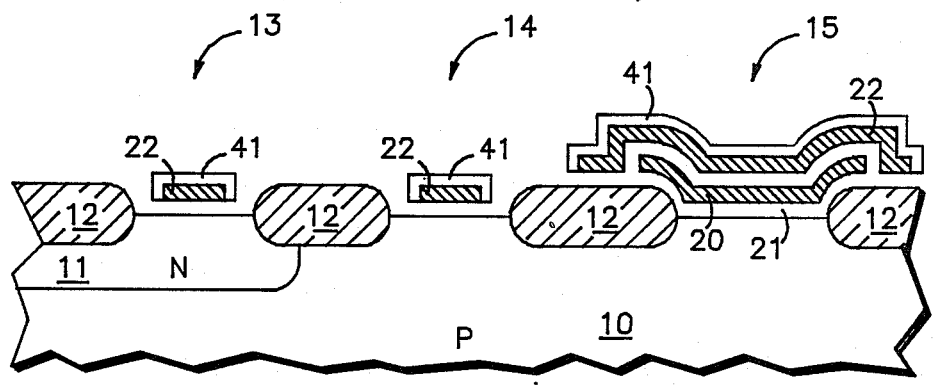

Referring now to FIG. 3C, the device is illustrated after an intervening process step has formed an oxide layer 41 overlying all exposed surfaces of second poly 22. Most commonly, oxide 41 is a simple thermal oxide of the underlying poly and has a thickness in the range of 0 to 600 angstroms. In this example of the invention, the width of the sidewall spacers is not related to patterning considerations in array portion 17, as was the case with the example illustrated with reference to FIGS. 1A-1I. Oxide 41 serves both as the sidewall spacers for the graded source/drain process and as a means for patterning first poly 20 and second poly 22, as will be more apparent from the further description below.

Figure 3D:
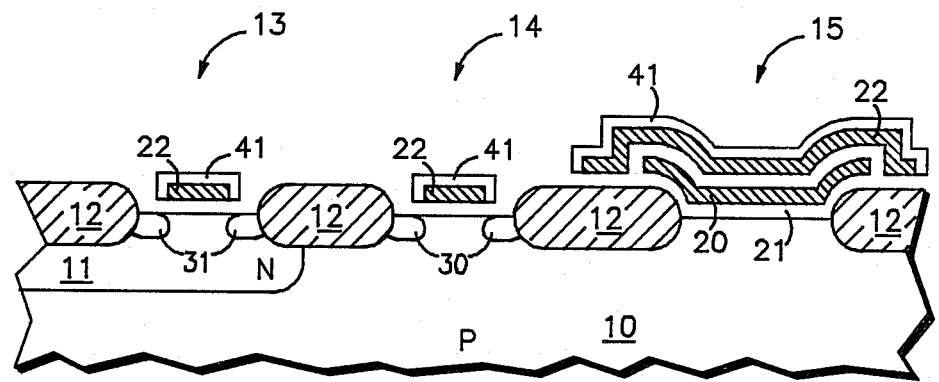

Referring now to FIG. 3D, the device is illustrated after intervening process steps have formed N-type grading implants 30 in active area 14 and P-type grading implants 31 in active area 13. The details of the grading implant steps are the same as those described above with reference to FIG. 1F.

Figure 3E:
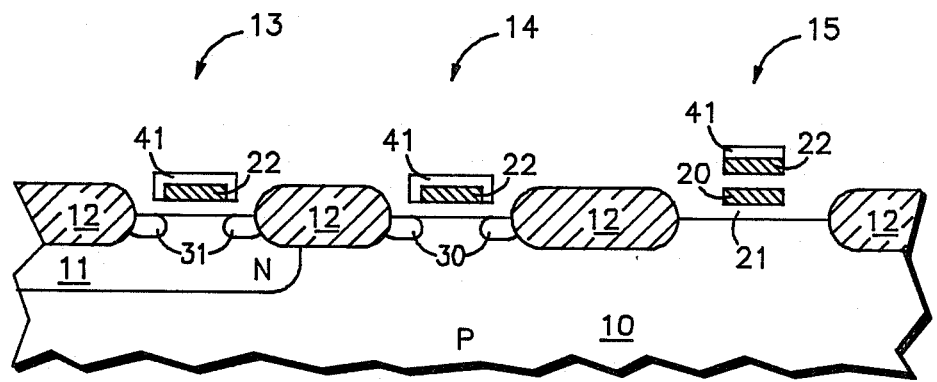

Referring now to FIG. 3E, the device is illustrated after intervening process steps have patterned oxide 41, second poly 22 and first poly 20 in array portion 17. A typical method of performing this patterning would be to deposit, expose and develop a photoresist overlying the entire device so that all of peripheral portion 16 and only the desired remaining portion of oxide 41 in array portion 17 are protected by photoresist; then performing an etch which removes oxide, but is selective to poly, thus patterning oxide 41 in array portion 17; then performing a poly-removing etch which is selective to oxide in order to pattern second poly 22 using the remaining portion of oxide 41 as a mask; then performing an etch to remove dielectric 23 while leaving first poly 20, and finally performing another poly-removing etch to transfer the pattern to first poly 20.

Figure 3F:
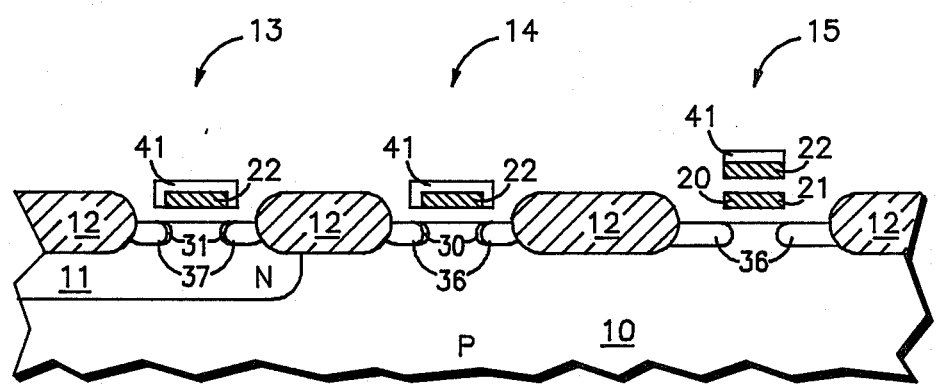

Referring now to FIG. 3F, the device is illustrated after intervening process steps have produced N-type source/drain implants 36 in active regions 14 and 15 and P-type source/drain implants in active region 13. The details of these implant steps are the same as those disclosed above.

While the process flow just described appears to be simpler than that disclosed with reference to FIGS. 1A-1I and FIGS. 2A-2D, in fact it requires two critical masks to pattern the second poly rather than the one critical mask of the earlier disclosed embodiment. The first critical mask is the one which patterns the second poly in the peripheral portion and the second critical mask is the one which controls the array patterning.

The three examples of modified source/drain regions in a non-volatile memory are all GSD-type processes. It is also possible, utilizing the principles of the present invention, to implement LDD-type modified source/drain regions in a non-volatile memory process. FIGS. 4A-4G illustrate a process similar to that described above with reference to FIGS. 1A-1I, but modified to implement the LDD concept.

Figure 4A:
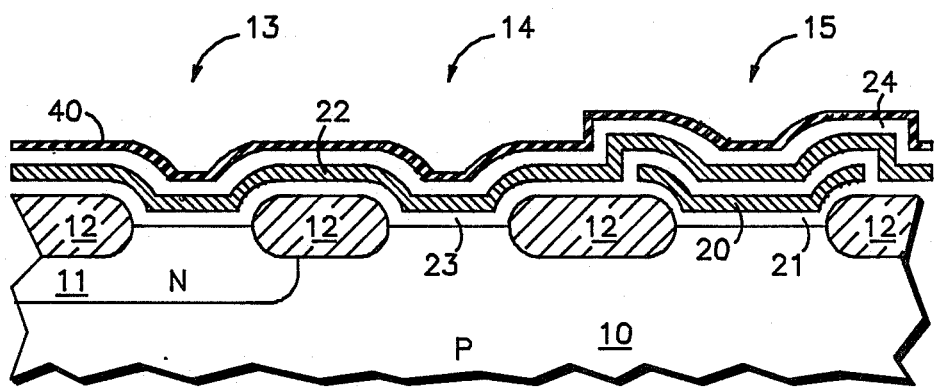
FIGS. 4A-4G are cross-sectional views of a non-volatile memory device illustrating various stages in the manufacture thereof according to yet another aspect of the present invention.

FIG. 4A illustrates a non-volatile memory device at an intermediate stage of its manufacture. This process flow shares the same starting point as the above-described processes (FIG. 1A) and the point in the process illustrated in FIG. 4A is identical to that illustrated in FIG. 2A. A first, partially patterned poly layer 20 overlies a dielectric 21 in array portion 17 of the device. A second, unpatterned poly layer 22 overlies a dielectric layer 23 and both overlie the entire device. A first protective layer 24 overlies second poly 22 and a second protective layer 40 overlies first protective layer 24.

Figure 4B:
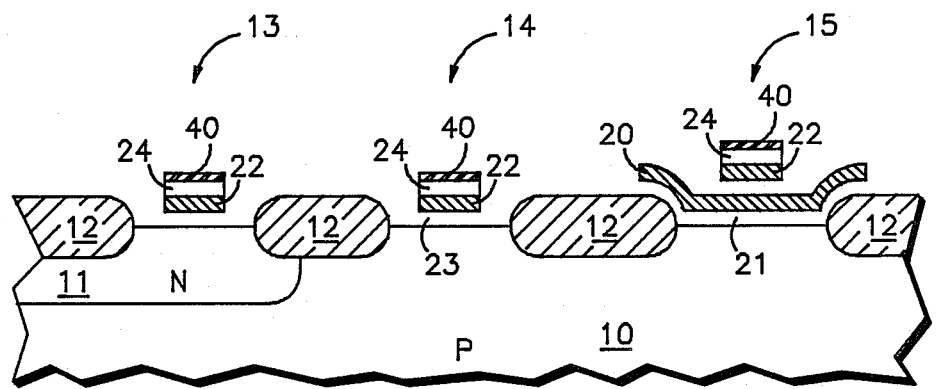

FIG. 4B illustrates the device after intervening process steps have completely patterned first and second protective layers 24 and 40 and second poly 22 using standard semiconductor processing techniques. This point is similar to that described above with reference to FIG. 1G, but without any sidewall oxide spacers. In low dose drain processing, the grading implants are performed self-aligned to the gate poly, prior to the formation of any type of spacer.

Figure 4C:
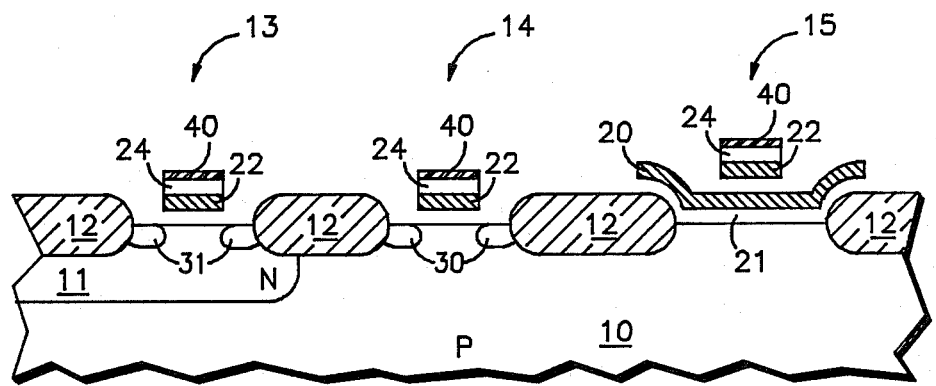

FIG. 4C illustrates the device after intervening process steps have formed N-type grading implants 30 in active region 14 and P-type grading implants in active region 13. The choice of implant ion species, energies and doses is most likely not substantially different from that described above. However, it is possible, since the low dose drain process does not rely on a faster diffusion rate for the first-implanted species, that both N-type implants be performed using an arsenic source. Once again, the problem of $BF_2$ implants in the presence of a nitride layer is encountered is second protective layer 40 is nitride, with the same possible solutions as were mentioned above.

Figure 4D:
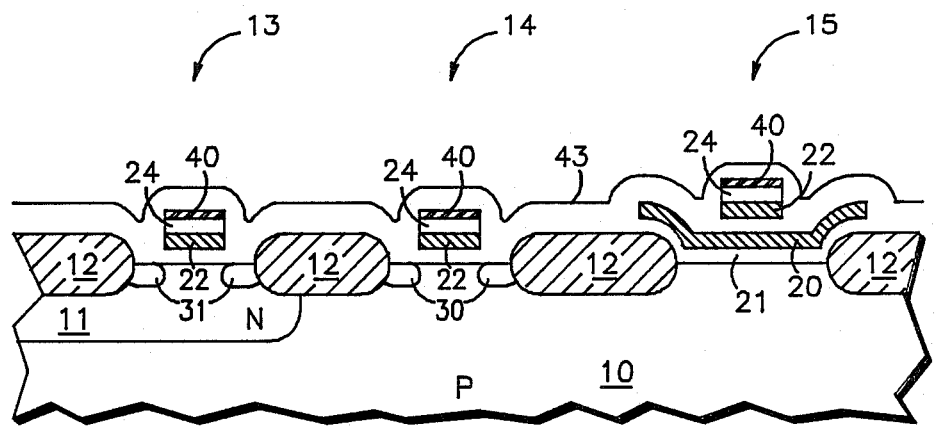

FIG. 4D illustrates the device after intervening process steps have formed a layer 43 of a spacer material over the entire device. The spacer material is advantageously an undoped LTO with a thickness in the range of 2000 to 6000 angstroms, although many materials and thicknesses are potentially applicable.

Figure 4E:
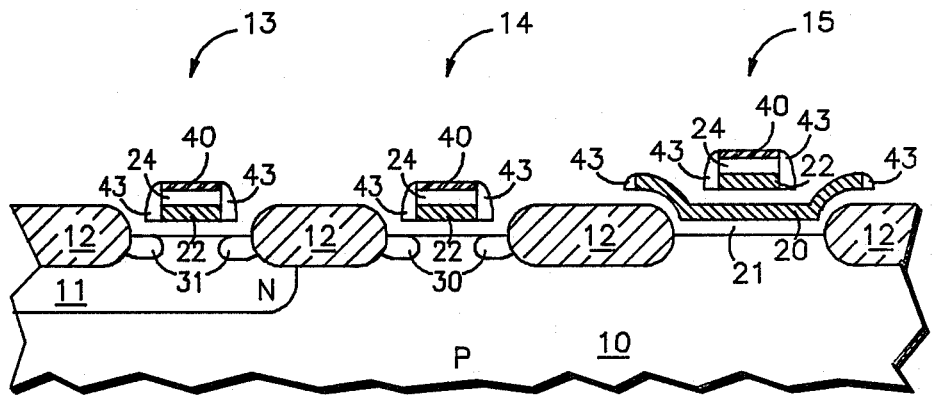

Referring now to FIG. 4E, the device is illustrated after intervening process steps have performed a spacer etch. A spacer etch is a relatively familiar process in semiconductor manufacturing in which an overlying layer of spacer material is anisotropically blanket-etched. The goal is to clear the underlying surfaces of the spacer material except for regions immediately adjacent vertical edges, where the overlying material layer was a bit thicker than elsewhere. Thus, in this case, spacers of material 43 are left adjacent each gate structure in active areas 13, 14 and 15.

Figure 4F:
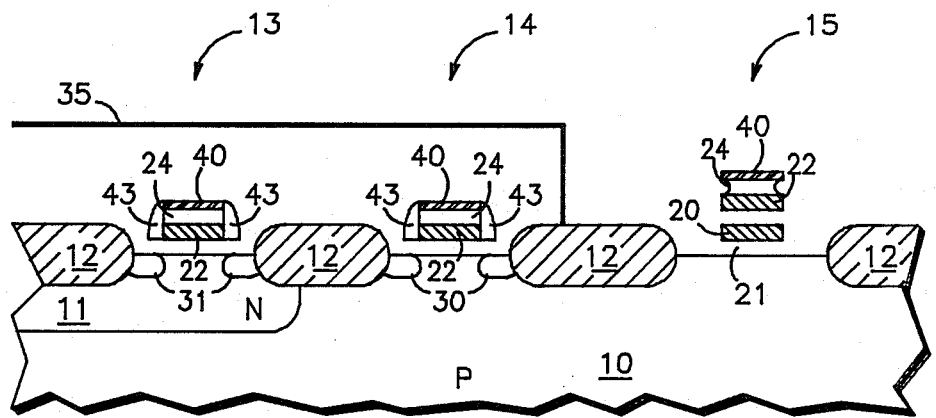

Referring now to FIG. 4F, the device is shown after intervening process steps have formed a self-aligned etch mask 35, removed spacer material 43 in array portion 17 and patterned first poly 20 therein. Self-aligned etch mask 35 is substantially similar to the one described above with reference to FIG. 1G. The process for removing spacer material 43 and patterning first poly 20 is substantially similar to that described above with reference to FIG. 2C.

Figure 4G:
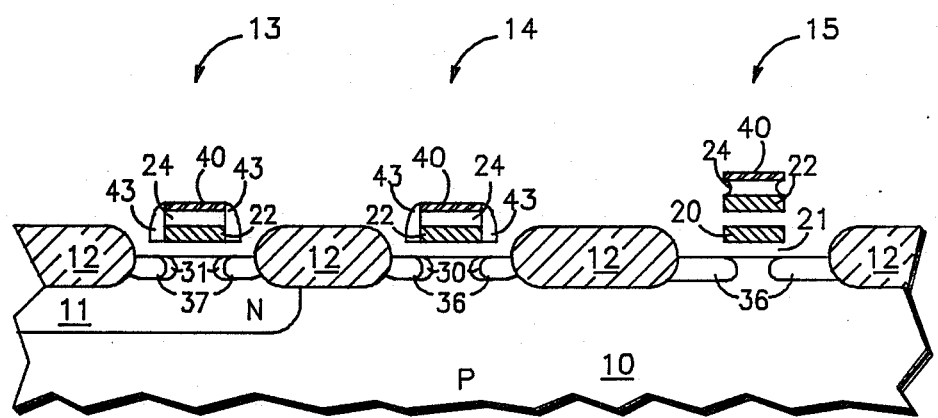

Referring to FIG. 4G, the device is illustrated after intervening process steps have removed the self-aligned etch mask and formed N-type source/drain implants 36 in active areas 14 and 15 and P-type source/drain implants in active area 13. The processes are substantially similar to those described above with reference to FIG. 1I.

As is apparent, the LDD process described above relies on the fact that the source drain implants are set back from the edge of the gates of transistors in the peripheral portion of the device, rather than on differential rates of diffusion, to provide the desired junction grading. Therefore, it is possible to use the same implant species for both the grading and source/drain implant steps. The process is similar to that described with reference to FIGS. 2A–2D in that the spacers in the array portion of the device are removed prior to source/drain implantation without the requirement for an extra masking step. The use of a nitride or similar protective layer allows the spacers to be removed.

The LDD process described with reference to FIGS. 4A–4G is similar to that described with reference to FIGS. 1A–1I and 2A–2D in that the second poly layer is completely patterned prior to the formation of any spacers. It is also possible to implement an LDD process according to the principles of the present invention in a manner similar to the process described with reference to FIGS. 3A–3F. FIGS. 5A–5E illustrate such a process.

Figure 5A:
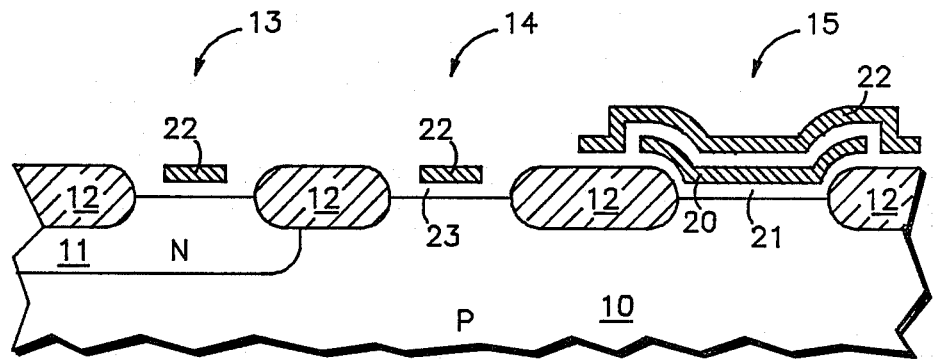
FIGS. 5A-5E are cross-sectional views of a non-volatile memory device illustrating various stages in the manufacture thereof according to yet another aspect of the present invention.

Referring now to FIG. 5A, a non-volatile memory device is shown at an intermediate stage of its manufacture. This point in the process, which started at the starting point described with reference to FIG. 1A, is identical to that described with reference to FIG. 3A. As with the other process flows described herein, it is possible to modify this process by patterning first poly 20 to form the gates of the transistors in peripheral portion 16 of the device and using second poly 22 only as the control gate in array portion 17. This modification may be advantageous in some circumstances, but it forces first poly 20 to be sufficiently thick and heavily doped to have a relatively low sheet rho. In addition, it is common to use a polycide (poly-crystalline silicon and a refractory metal silicide) only for second poly 22, which implies that the peripheral devices have a pure poly-crystalline silicon gate.

Figure 5B:
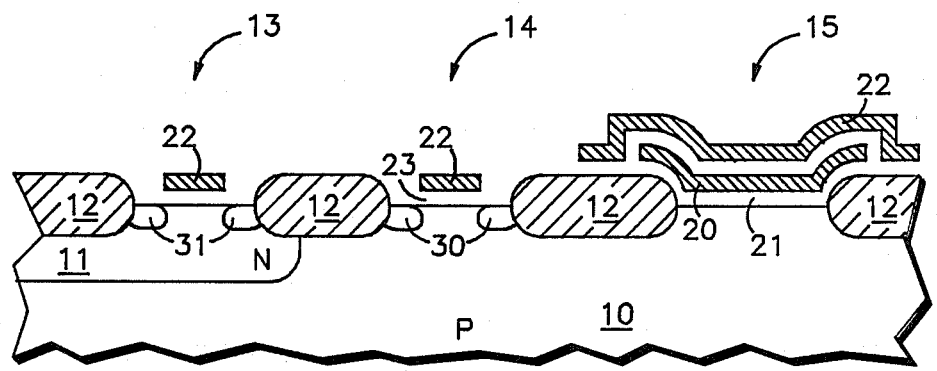

Referring now to FIG. 5B, the device is illustrated after intervening process steps have formed N-type grading implants 30 in active area 14 and P-type grading implants 31 in active area 13. The specifics of dopant species, beam energies and dose levels are substantially the same as those described above.

Figure 5C:
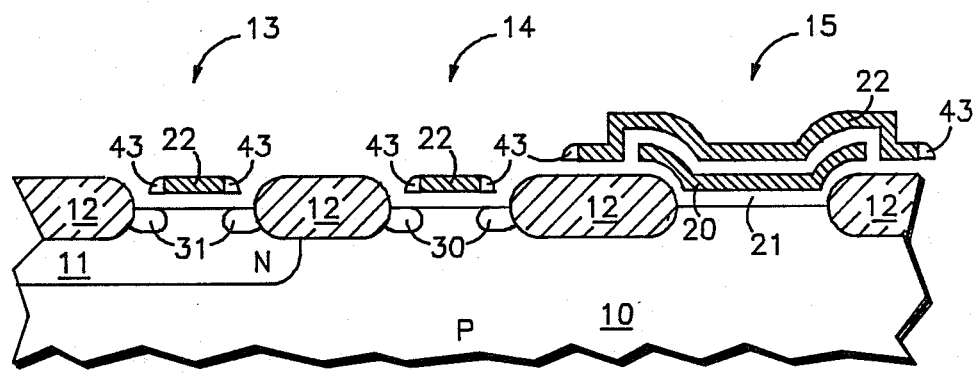

Referring now to FIG. 5C, the device is illustrated after intervening process steps have deposited a layer of a spacer material 43 overlying the entire device and performed a spacer etch as described above with reference to FIG. 4E. In this case, because of the fact that second poly 22 has not been fully patterned in array portion 17, no spacer material remains within array portion 17 to be removed later.

Figure 5D:
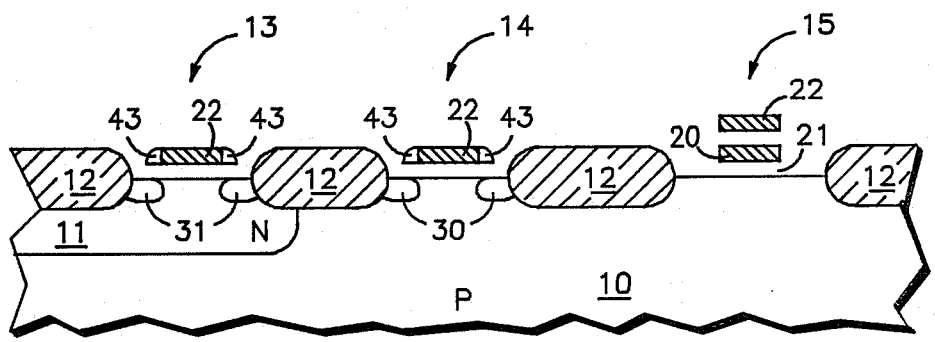

Referring now to FIG. 5D, the device is illustrated after intervening process steps have patterned first poly 20 and second poly 22 within array portion 17 to their final geometry. This patterning may be performed according to standard semiconductor processing techniques.

Figure 5E:
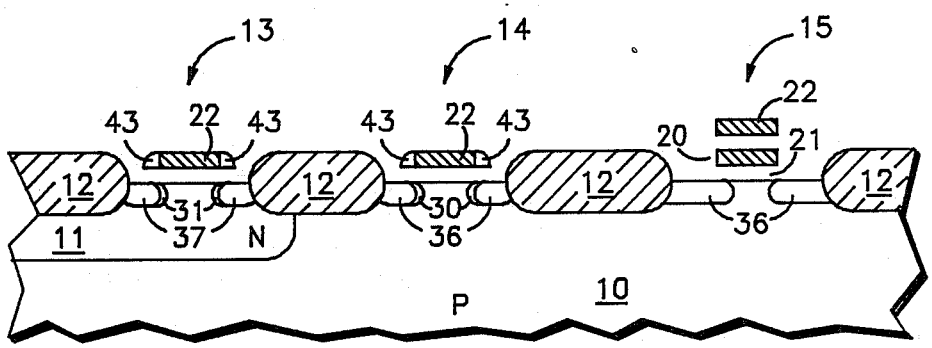

Referring now to FIG. 5E, the device is illustrated after intervening process steps have formed N-type source drain implants 36 in active regions 14 and 15 and P-type source/drain regions 37 in active region 13. Once again, the previously described dopant species, beam energies and dosages may be applied here.

This process is similar to that described with reference to FIGS. 3A–3F in that it avoids the need to remove spacers in the array prior to performing source/drain implants, but at the cost of using two critical masks to pattern the second poly rather than one.

The various processes described above for implementing modified source/drain regions in the peripheral portions only of non-volatile memories have several features in common. Primarily, all either avoid the need to remove spacers related to the modified source/drain process from the peripheral portion of the array or perform the removal with a non-critical mask step which coincides with a self-aligned etch step previously existing in the process. The various trade-offs mentioned in connection with each example will make one of the disclosed examples or some variation within the principles of the present invention more useful than the others for a particular application.

While the present invention has been disclosed with reference to several particular embodiments thereof, various modifications and changes thereto will be apparent to one skilled in the art and are within the spirit and scope of the present invention.

We claim:

1. A method of manufacturing a non-volatile memory device comprising the steps of:

defining, at a first surface of a body of semiconductor material, a plurality of active regions, a first group of said active regions being in an array portion of the device and a second group of said active regions being in a peripheral portion of the device;

forming and partially patterning first and second poly layers overlying said first surface of said body of semiconductor material, said first and second poly layers being completely patterned over said peripheral portion of the device to form gates of peripheral transistors and being partially patterned over said array portion of the device to leave at least one of said first and second poly layers completely covering each of said active regions in said first group thereof;

performing at least one grading implant to partially form modified source/drain regions in said body of semiconductor material within at least one active region in said second group thereof;

subsequent to performing said at least one grading implant, completing the patterning of said first and second poly layers over said array portion of said memory to form at least floating gates of array transistors; and performing at least one source/drain implant to complete the formation of said modified source/drain regions and to form unmodified source/drain regions in at least one active region in said first group thereof.

2. A method according to claim 1 further comprising the step of:

forming spacers adjacent all exposed edges of said partially patterned first and second poly layers.

3. A method according to claim 2 wherein said step of partially patterning said first and second poly layers further comprises the steps of:

partially patterning said first poly layer; and
completely patterning said second poly layer.

4. A method according to claim 3 wherein said step of completing the patterning of said first and second poly layers over said array portion of the device is performed without removing said spacers.

5. A method according to claim 3 further comprising the step of:

removing said spacers in said array portion of said device using a mask also used in said step of completing the patterning of said first and second poly layers in said array portion.

6. A method according to claim 2 wherein said step of partially patterning said first and second poly layers further comprises the step of:

leaving said second poly layer completely covering said first poly layer in said array portion of said device.

7. A method according to claim 2 further characterized in that:

said step of performing at least one grading implant and said step of performing at least one source/drain implant are both carried out after said step of forming spacers.

8. A method according to claim 2 further characterized in that:

said step of performing at least one grading implant is carried out prior to said step of forming spacers and said step of performing at least one source/drain implant is carried out subsequent to said step of forming spacers.

9. A method of manufacturing a non-volatile memory device comprising the steps of:

defining, at a first surface of a body of semiconductor material, a plurality of active regions, a first group of said active regions being in an array portion of the device and a second group of said active regions being in a peripheral portion of the device;

forming and partially patterning a first poly layer overlying said first surface of said body of semiconductor material, said first poly layer being completely patterned over said peripheral portion of the device and being partially patterned over said array portion of the device said first poly layer completely covering each of said active regions in said first group thereof;

forming and completely patterning a second poly layer overlying said first poly layer and said first surface of said body of semiconductor material one of said first poly layer and said second poly layer forming gates of peripheral transistors and said second poly forming control gates of array transistors;

performing at least one grading implant to partially form modified source/drain regions in said body of semiconductor material within at least one active region in said second group thereof;

completing the patterning of said first poly layer to form floating gates of said array transistors subsequent to said step of performing at least one grading implant; and performing at least one source/drain implant to complete the formation of said modified source/drain regions and to form unmodified source/drain regions in at least one active region in said first group thereof.

10. A method according to claim 9 further comprising the step of:

forming spacers adjacent all exposed edges of said first and second poly layers prior to said step of performing at least one grading implant.

11. A method according to claim 10 further comprising the steps of:

forming a first protective layer overlying said second poly layer; and patterning said first protective layer with a mask defining the desired final geometry of said second poly layer prior to patterning said second poly layer.

12. A method according to claim 11 wherein said step of completing the patterning of said first poly layer comprises the step of:

patterning said first poly layer using said patterned first protective layer and said spacers as a mask.

13. A method according to claim 10 further comprising the steps of:

forming first and seccond protective layers overlying said second poly layer;

patterning said second protective layer with a mask defining the desired final geometry of said second poly layer;

patterning said first protective layer using said patterned second protective layer as a mask;

patterning said second poly layer using said first protective layer as a mask; and removing said spacers ajdacent said exposed edges of said second poly layer using said second protective layer as a mask prior to performing said at least one source/drain implant.

14. A method according to claim 9 further comprising the step of:

forming spacers adjacent all exposed edges of said first and second poly layers subsequent to said step of performing at least one grading implant.

15. A method according to claim 14 further of comprising the steps of:

forming a first protective layer overlying said second poly layer; and patterning said first protective layer with a mask defining the desired final geometry of said second poly layer prior to patterning said second poly layer.

16. A method according to claim 15 wherein said step of completing the patterning of said first poly layer comprises the step of:

patterning said first poly layer using said patterned first protective layer and said spacers as a mask.

17. A method according to claim 14 further comprising the steps of:

forming first and second protective layers overlying said second poly layer;

patterning said second protective layer with a mask defining the desired final geometry of said second poly layer;

patterning said first protective layer using said patterned second protective layer as a mask;

patterning said second poly layer using said first protective layer as a mask; and removing said spacers adjacent said exposed edges of said second poly layer using said second protective layer as a mask prior to performing said at least one source/drain implant.

18. A method of manufacturing a non-volatile memory device comprising the steps of:

defining, at a first surface of a body of semiconductor material, a plurality of active regions, a first group of said active regions being in an array portion of the device and a second group of said active regions being in a peripheral portion of the device;

forming and partially patterning a first poly layer overlying said first surface of said body of semiconductor material, said first poly layer being completely patterned over said peripheral portion of the device and overlying said entire array portion of the device;

forming and partially patterning a second poly layer overlying said first poly layer and said first surface of said body of semiconductor material, said second poly layer being completely patterned over said peripheral portion of the device and overlying said entire array portion of the device one of said first and second poly layers forming gates of peripheral transistors;

performing at least one grading implant to partially form modified source/drain regions in said body of semiconductor material within at least one active region in said second group thereof;

subsequent to performing said at least one grading implant, completing the patterning of said first and second poly layers over said array portion of said memory to form at least floating gates of array transistors; and performing at least one source/drain implant to complete the formation of said modified source/drain regions and to form unmodified source/drain regions in at least one active region in said first group thereof.

19. A method according to claim 18 further comprising the step of:

forming spacers adjacent all exposed edges of said first and second poly layers prior to said step of completing the patterning of said first and second poly layers.

* * * * *